United States Patent
Lin et al.

(10) Patent No.: US 9,470,459 B2
(45) Date of Patent: Oct. 18, 2016

(54) SUPPORT STRUCTURE FOR HEAT DISSIPATION UNIT

(71) Applicant: ASIA VITAL COMPONENTS CO., LTD., Sinjhuang District, New Taipei (TW)

(72) Inventors: Chih-Yeh Lin, New Taipei (TW); Chuan-Chin Huang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 234 days.

(21) Appl. No.: 13/933,088

(22) Filed: Jul. 1, 2013

(65) Prior Publication Data

US 2015/0000866 A1 Jan. 1, 2015

(51) Int. Cl.
*F28D 15/04* (2006.01)
*F28D 15/02* (2006.01)
*H01L 23/427* (2006.01)

(52) U.S. Cl.
CPC ......... *F28D 15/0233* (2013.01); *F28D 15/046* (2013.01); *H01L 23/427* (2013.01); *F28F 2245/02* (2013.01); *F28F 2245/04* (2013.01); *H01L 2924/0002* (2013.01)

(58) Field of Classification Search
CPC ....................................................... F28D 15/00
USPC .................................... 165/104.26; 361/700
See application file for complete search history.

(56) References Cited

U.S. PATENT DOCUMENTS

| 4,082,575 | A | * | 4/1978 | Eastman | ...................... 148/6.35 |
| 6,269,866 | B1 | * | 8/2001 | Yamamoto | .......... F28D 15/0233 |
| | | | | | 165/104.26 |
| 8,813,834 | B2 | * | 8/2014 | Chin | ........................ 165/104.26 |
| 2005/0126758 | A1 | * | 6/2005 | Schulz-Harder | .......... 165/104.21 |
| 2006/0222423 | A1 | * | 10/2006 | Dejong et al. | ........ F28D 15/046 |
| | | | | | 399/333 |
| 2008/0029249 | A1 | * | 2/2008 | Hsiao | ....................... 165/104.26 |
| 2013/0008634 | A1 | * | 1/2013 | Yang | ................... F28D 15/0266 |
| | | | | | 165/133 |

FOREIGN PATENT DOCUMENTS

| TW | 201027024 A | 7/2010 |
| TW | 443873 U | 12/2012 |
| TW | 452370 U | 5/2013 |

* cited by examiner

*Primary Examiner* — Allen Flanigan
(74) *Attorney, Agent, or Firm* — C. G. Mersereau; Nikolai & Mersereau, P.A.

(57) ABSTRACT

A support structure for heat dissipation unit includes at least one main body and an oxide coating. Multiple grooves are formed on an outer circumference of the main body. The oxide coating is coated on the outer circumference of the main body and the surfaces of the grooves. The sintered powder body can be replaced with the support structure with the directional oxide coating coated on the outer circumference of the main body and the surfaces of the grooves to greatly speed the vapor-liquid circulation of the working fluid in the chamber of the heat dissipation unit so as to enhance the heat dissipation performance.

5 Claims, 6 Drawing Sheets

SUPPORT STRUCTURE FOR HEAT DISSIPATION UNIT

BACKGROUND OF THE INVENTION

1. Field of the Invention

The present invention relates generally to a support structure for heat dissipation unit, which can substitute for the sintered powder body to greatly enhance the vapor-liquid circulation efficiency of the working fluid.

2. Description of the Related Art

Along with the rapid advance of scientific and technologic industries, electronic devices have more and more powerful functions. For example, the operation speed of central processing unit (CPU), chip set and electronic components of display unit has become faster and faster. This leads to higher heat generated by the electronic components per unit time. In case that the heat is not dissipated in time, the operation of the entire electronic device will be affected or even the electronic components will burn out.

In general, the heat generated by the electronic components is dissipated by means of cooling fan, heat sink or heat pipe. The heat sink is in contact with a heat source. Via the heat pipe, the heat generated by the heat source is transferred to a remote end for dissipating the heat. Alternatively, the cooling fan can forcedly guide airflow to carry away the heat of the heat sink. With respect to a narrow space or a large-area heat source, a vapor chamber is often selectively used as a heat conduction member for dissipating the heat.

A conventional vapor chamber is composed of two board materials mated with each other. The board materials are mated with each other to define a closed chamber in a vacuum state. The closed chamber has support structure and capillary structure. The support structure is generally classified into two types. The first type of support structure has capillary structure on outer side, which is formed of sintered powder.

Accordingly, the support structure not only can provide support effect, but also can make the working fluid flow from the condensation end of the upper board back to the evaporation end of the lower board under capillary attraction so as to achieve vapor-liquid circulation effect. The second type of support structure is entirely formed of sintered copper powder. Similarly, the second type of support structure not only can provide support effect, but also can make the working fluid flow from the condensation end of the upper board back to the evaporation end of the lower board.

However, there is a problem existing in the conventional vapor chamber, that is, the denser the porosity of the capillary structure (the sintered powder body) of the support structure is, the greater the capillary attraction of the capillary structure is. While the capillary attraction of the capillary structure is increased, the resistance against the fluid is increased. The capillary attraction of the capillary structure of the sintered copper powder and the resistance against the fluid are two factors conflicting with each other. As a result, even under the capillary attraction of the capillary structure (the sintered powder body) of the support structure, the condensed working fluid can hardly quickly flow back to the evaporation end of the lower board. Therefore, the flowability of the vapor-liquid working fluid is poor and the heat dissipation efficiency is lowered.

According to the above, the conventional vapor chamber has the following shortcomings:
1. The flowability of the vapor-liquid working fluid is poor.
2. The heat dissipation efficiency is lowered.

SUMMARY OF THE INVENTION

It is therefore a primary object of the present invention to provide a support structure for heat dissipation unit, which can substitute for the sintered powder body.

It is a further object of the present invention to provide the above support structure for heat dissipation unit, which can enhance the vapor-liquid circulation efficiency of the working fluid.

It is still a further object of the present invention to provide the above support structure for heat dissipation unit, which can enhance the heat dissipation efficiency.

To achieve the above and other objects, the support structure for heat dissipation unit of the present invention includes at least one main body and an oxide coating. The main body has multiple grooves formed on an outer circumference of the main body. The grooves extend from one end of the main body to the opposite end of the main body. The oxide coating is coated on the outer circumference of the main body and the surfaces of the grooves. The sintered powder body can be replaced with the support structure with the oxide coating coated on the outer circumference of the main body and the surfaces of the grooves. The support structure can greatly speed the vapor-liquid circulation of the working fluid in the chamber of the heat dissipation unit so as to enhance the heat dissipation performance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
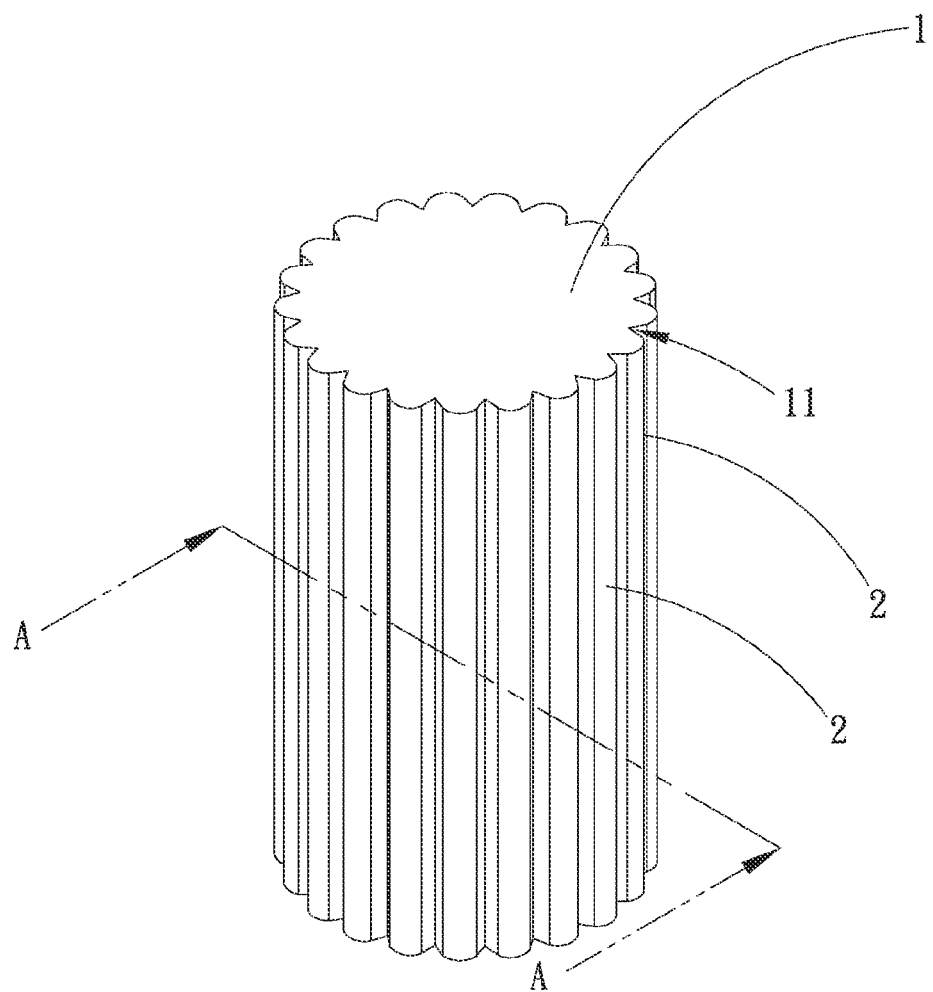
FIG. 1A is a perspective view of a preferred embodiment of the present invention.
Figure 1B:
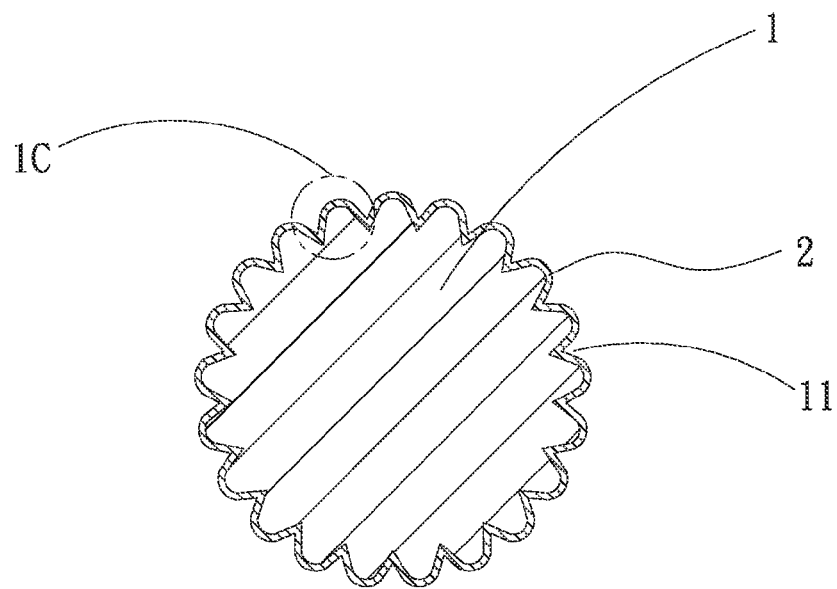
FIG. 1B is a sectional view taken along line A-A of FIG. 1A.
Figure 2:
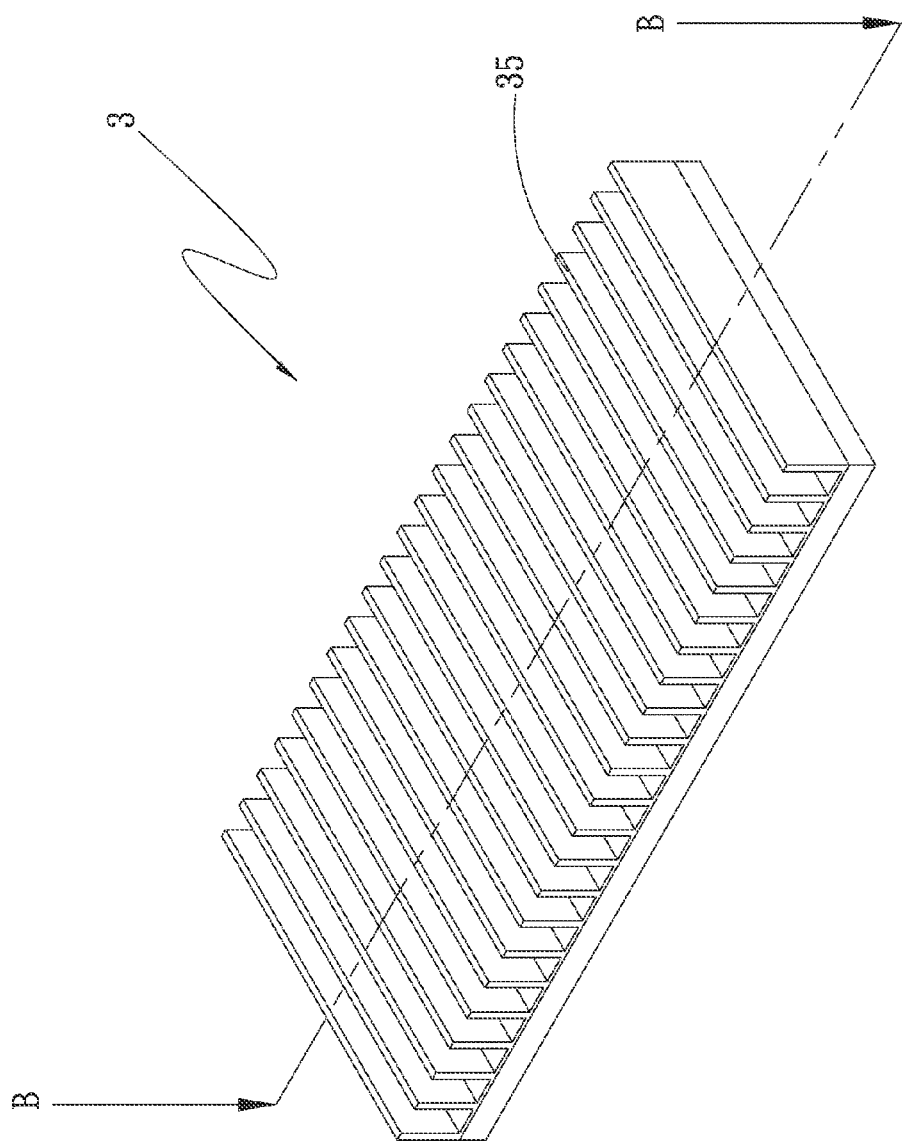
FIG. 2 is a perspective view of a heat dissipation unit to which the preferred embodiment of the present invention is applied.

Please refer to FIGS. 1A, 1B and 2. FIG. 1A is a perspective view of a preferred embodiment of the present invention. FIG. 1B is a sectional view taken along line A-A of FIG. 1A. FIG. 2 is a perspective view of a heat dissipation unit to which the preferred embodiment of the present invention is applied. According to the preferred embodiment, the support structure for heat dissipation unit of the present invention is applied to a heat dissipation unit 3. In this embodiment, the heat dissipation unit 3 is, but not limited to, a vapor chamber for illustration purposes only. In practice, the heat dissipation unit 3 can be alternatively a flat-plate heat pipe or a heat radiation board.

The support structure includes at least one main body 1 and an oxide coating 2. The main body 1 is made of a material with high thermal conductivity, such as copper, silver, aluminum or an alloy thereof. In this embodiment, the main body 1 is a copper column. The main body 1 is formed with multiple grooves 11 formed on an outer circumference of the main body 1. The grooves 11 extend from one end of the main body 1 to the opposite end of the main body 1. In this embodiment, the grooves 11 are, but not limited to, arranged on the outer circumference of the main body 1 at equal intervals for illustration purposes only. In practice, the grooves 11 can be alternatively arranged on the outer circumference of the main body 1 at unequal intervals.

In addition, the grooves 11 are formed on the outer circumference of the main body 1 to change the quality of the surface of the main body 1 and effectively reduce the contact angle between the working liquid (the working fluid) and the surface of the solid. Under such circumstance, the surface tension of the liquid working fluid 6 on the surface of the copper-made main body 1 is increased. In this case, the liquid working fluid 6 can flow in a specific direction to lower the resistance against the flow.

In this embodiment, the oxide coating 2 is a hydrophilic coating or a hydrophobic coating. In this embodiment, the oxide coating 2 is, but not limited to, a hydrophilic coating for illustration purposes only. The oxide coating 2 (hydrophilic coating) is coated on the outer circumference of the main body 1 and the surfaces of the grooves 11. To speak more specifically, dioxide silicon ($SiO_2$) coating is coated on the outer circumference of the main body 1 and the surfaces of the grooves 11 by means of sol-gel immersion plating as the oxide coating 2 with ultra-hydrophilicity. Accordingly, the flowing direction of the liquid working fluid 6 is controllable.

According to the above arrangement, the support structure formed with the grooves 11 and coated with the oxide coating 2 of the present invention is applied to the heat dissipation unit 3 to support the vapor chamber and increase the strength thereof. In addition, the oxide coating 2 has ultra-hydrophilicity so that the support structure can provide sufficient capillary attraction for the backflow of the liquid working fluid. Accordingly, the problem of resistance against the fluid of the sintered powder body of the conventional support structure is solved.

Figure 1C:
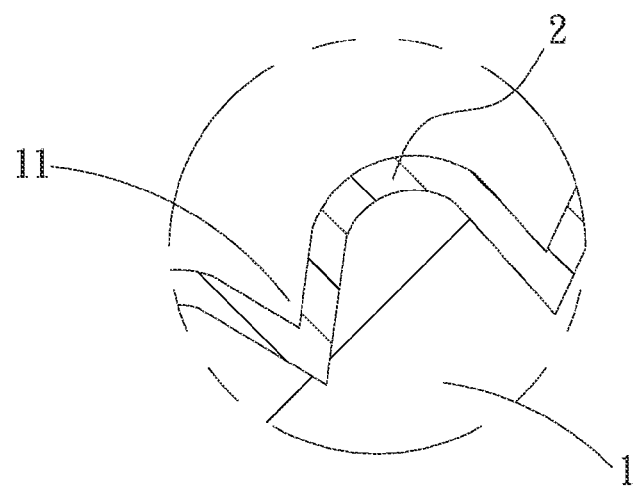
FIG. 1C is an enlarged view of circled area 1C of FIG. 1B.
Figure 1D:
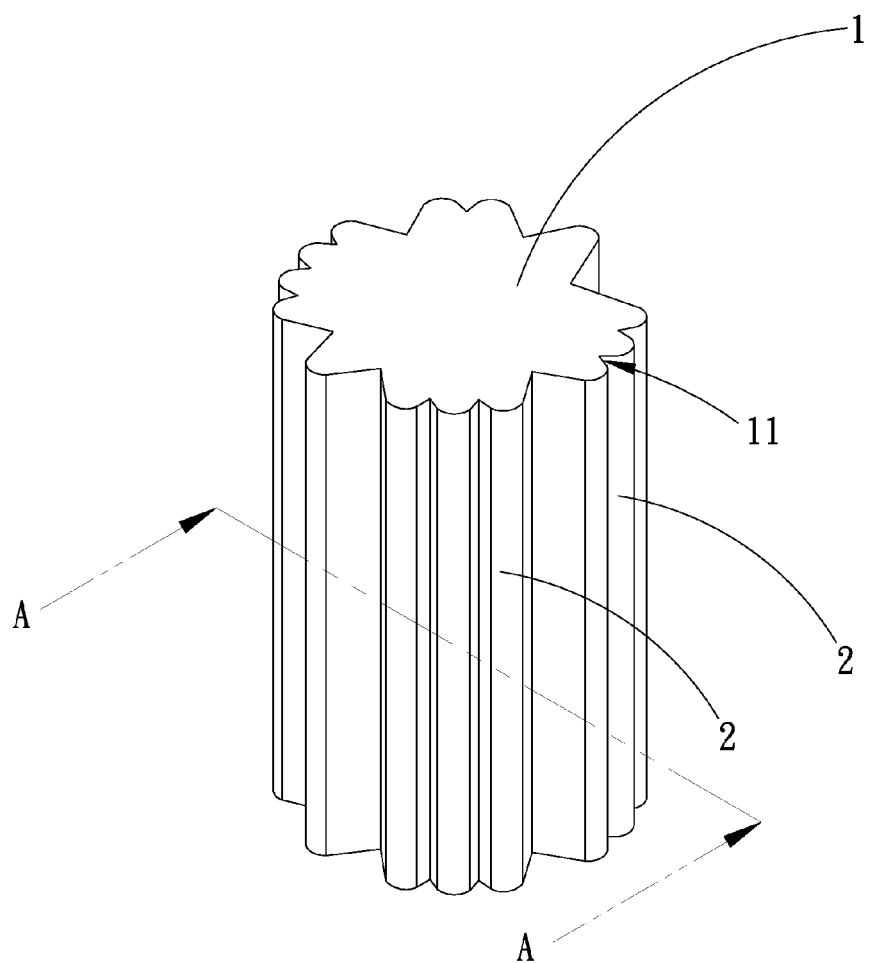
FIG. 1D is a perspective view of an alternate embodiment of the present invention.
Figure 1E:
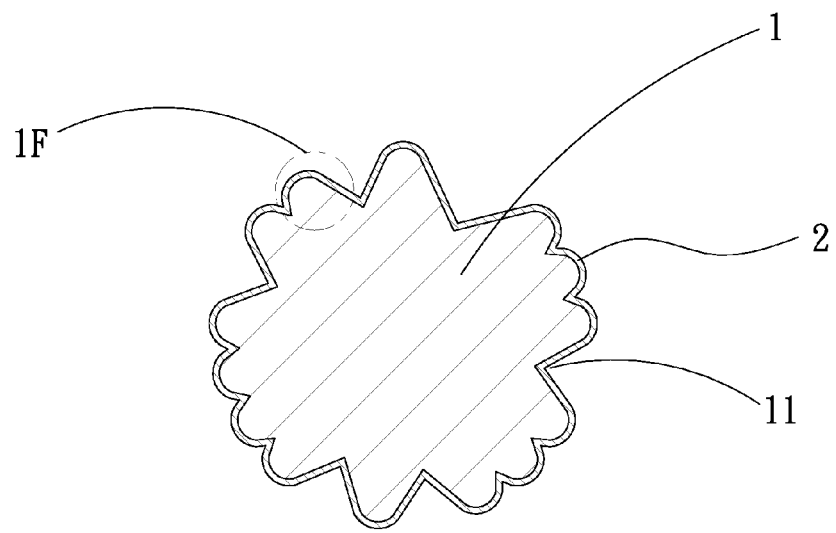
FIG. 1E is a sectional view taken along line A-A of FIG. 1D.
Figure 1F:
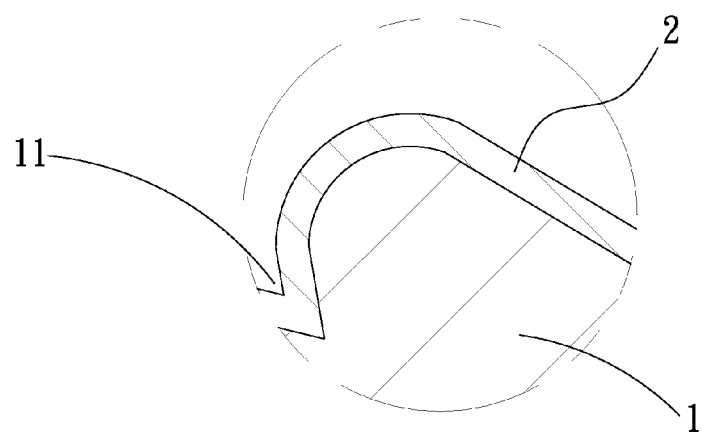
FIG. 1F is an enlarged view of the circled area of FIG. 1E.
Figure 3:
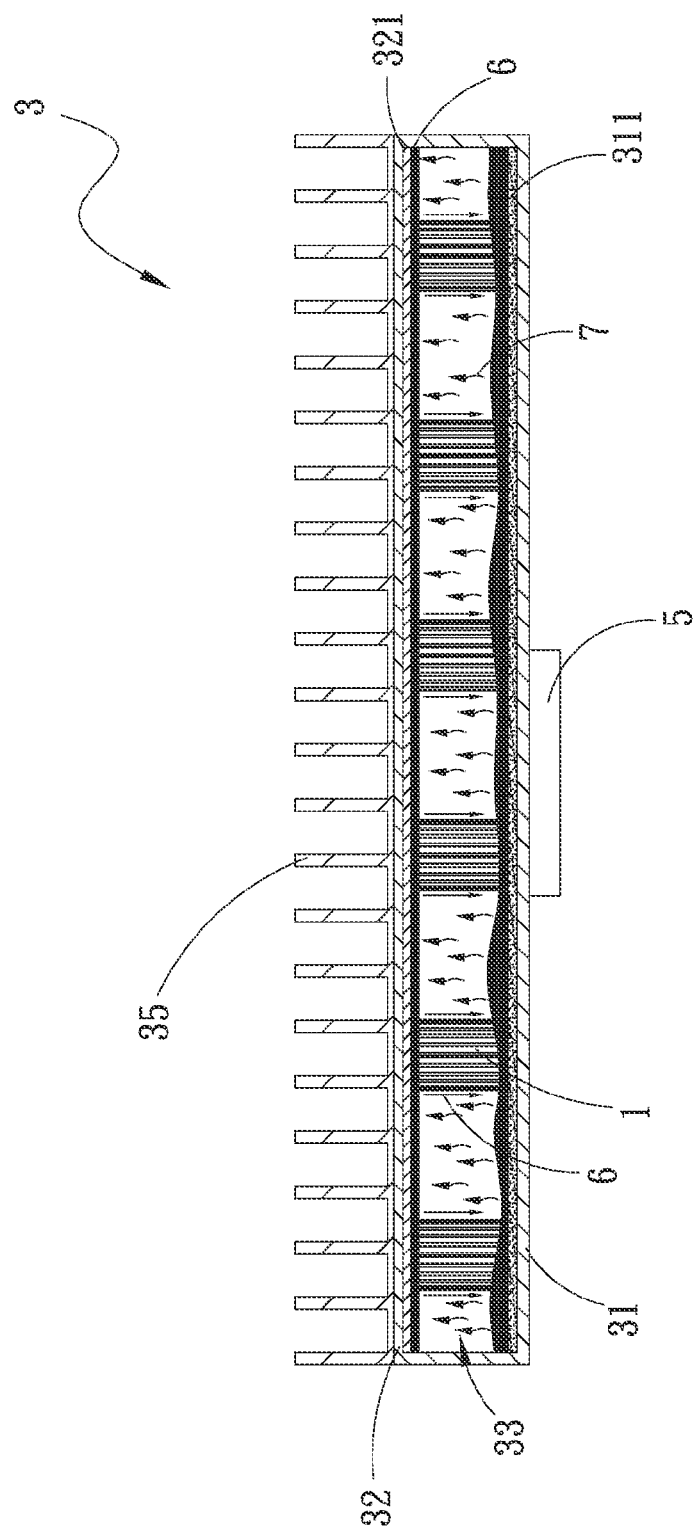
FIG. 3 is a sectional view taken along line B-B of FIG. 2.

Please now refer to FIGS. 2 and 3 as well as FIGS. 1A to 1C. The heat dissipation unit 3 has a first plane plate 31 and a second plane plate 32 opposite to the first plane plate 31. The first and second plane plates 31, 32 define therebetween a chamber 33. The main body 1 is received in the chamber 33. In practice, the number of the main bodies 1 is adjustable according to the necessary support strength. A first end and a second end of the main body 1 respectively abut against inner faces of the first plane plate 31 and the second plane plate 32. A working fluid is filled in the chamber 33. In this embodiment, the working fluid is, but not limited to, water for illustration purposes only. In practice, the working fluid is selected from a group consisting of pure water, inorganic compound, alcohol, ketone, liquid metal, coolant, organic compound and a mixture thereof.

The inner faces of the first and second plane plates 31, 32 are respectively formed with a capillary structure 311 and a hydrophilic coating 321. In this embodiment, the capillary structure 311 of the first plane plate 31 is, but not limited to, a sintered powder body for illustration purposes only. In practice, the capillary structure 311 can be alternatively a channeled structure or a mesh body. In practice, the hydrophilic coating 321 of the second plane plate 32 can be replaced with a capillary structure selected from a group consisting of sintered powder body, channeled structure and mesh body. An outer face of the first plane plate 31 is attached to a heat generation component 5 such as a central processor, a display chip, a Southbridge chip, a Northbridge chip and a transistor. That is, the first plane plate 31 serves as an evaporation end, while the second plane plate 32 serves as a condensation end. A radiating fin assembly 35 having multiple radiating fins is disposed on an outer face of the second plane plate 32.

When the heat generation component 5 generates heat, the liquid working fluid 6 in the capillary structure 311 of the first plane plate 31 (the evaporation end) absorbs the heat to phase-change into vapor working fluid 7. The vapor working fluid 7 will quickly flow within the chamber 33 to the second plane plate 32 (the condensation end). After the vapor working fluid 7 flows to the second plane plate 32, the radiating fin assembly 35 will absorb the heat of the vapor working fluid 7 and dissipate the heat by way of radiation. At this time, the vapor working fluid 7 on the second plane plate 32 releases a great amount of latent heat to phase-change into liquid working fluid 6. Under the capillary attraction of the hydrophilic coating 321 of the second plane plate 32, part of the liquid working fluid 6 is transferred back to the first plane plate 31. At the same time, under the capillary attraction of the hydrophilic and directional oxide coating 2 coated on the outer circumference of the main body 1 and the surfaces of the grooves 11, other part of the liquid working fluid 6 on the second plane plate 32 immediately flows back to the first plane plate 31. Accordingly, the circulation speed of the working fluid is greatly increased to continuously carry away the heat. Therefore, the heat dissipation performance is effectively enhanced.

The support structure of the present invention with the oxide coating 2 coated on the outer circumference of the main body 1 and the surfaces of the grooves 11 is applied to the heat dissipation unit 3 to greatly speed the vapor-liquid circulation of the working fluid in the chamber 33 of the heat dissipation unit 3 so as to enhance the heat dissipation performance. The sintered powder body can be replaced with the support structure of the present invention.

In conclusion, in comparison with the conventional vapor chamber, the present invention has the following advantages:
1. The sintered powder body can be replaced with the support structure of the present invention with the oxide coating coated on the outer circumference of the main body and the surfaces of the grooves.
2. The support structure of the present invention can greatly speed the vapor-liquid circulation of the working fluid in the chamber of the heat dissipation unit so as to enhance the heat dissipation performance.

The present invention has been described with the above embodiments thereof and it is understood that many changes and modifications in the above embodiments can be carried out without departing from the scope and the spirit of the invention that is intended to be limited only by the appended claims.

What is claimed is:
1. A support structure for a heat dissipation unit, comprising:
   at least one main body having multiple grooves formed on an outer circumference of the main body, the grooves extending from one end of the main body to the opposite end of the main body; and an oxide coating coated on the outer circumference of the main body and surfaces of the grooves applied by means of sol-gel immersion plating;
wherein the oxide coating is a hydrophobic coating; and
wherein the grooves are arranged on the outer circumference of the main body at unequal intervals.

2. The support structure for a heat dissipation unit as claimed in claim 1, wherein the main body is a copper column and made of a material with high thermal conductivity.

3. The support structure for a heat dissipation unit as claimed in claim 1, applied to the heat dissipation unit, the heat dissipation unit being selected from the group consisting of a vapor chamber, a flat-plate heat pipe or a heat radiation board.

4. The support structure for a heat dissipation unit as claimed in claim 1, applied to the heat dissipation unit, the heat dissipation unit having a first plane plate and a second plane plate opposite to the first plane plate, the first and second plane plates defining therebetween a chamber, the main body being received in the chamber, a first end and a second end of the main body respectively abutting against inner faces of the first plane plate and the second plane plate, a working fluid being filled in the chamber.

5. The support structure for a heat dissipation unit as claimed in claim 4, wherein inner faces of the first and second plane plates are respectively formed with a capillary structure and a hydrophilic coating, a radiating fin assembly having multiple radiating fins being disposed on an outer face of the second plane plate, an outer face of the first plane plate being attached to a heat generation component.

* * * * *